United States Patent [19]

Burnham et al.

[11] Patent Number: 5,008,737
[45] Date of Patent: Apr. 16, 1991

[54] DIAMOND COMPOSITE HEAT SINK FOR USE WITH SEMICONDUCTOR DEVICES

[75] Inventors: Robert D. Burnham, Wheaton; Ricardo S. Sussmann, Naperville, both of Ill.

[73] Assignee: Amoco Corporation, Chicago, Ill.

[21] Appl. No.: 255,259

[22] Filed: Oct. 11, 1988

[51] Int. Cl.$^5$ .................................... H01L 23/36
[52] U.S. Cl. ................................ 357/81; 423/446; 165/905
[58] Field of Search ................. 357/81; 165/905; 423/446

[56] References Cited

U.S. PATENT DOCUMENTS

| 3,969,754 | 7/1976 | Kumiya et al. | 357/81 |
| 4,239,502 | 12/1980 | Slack | 357/81 |
| 4,412,480 | 11/1983 | Tsuji et al. | 423/446 |

Primary Examiner—Jerome Jackson, Jr.
Attorney, Agent, or Firm—James A. Gabala; William H. Magidson; Ralph C. Medhurst

[57] ABSTRACT

A composite comprised of diamond particles embedded in a metal matrix is a highly satisfactory heat sink material for use with a semiconductor.

16 Claims, 1 Drawing Sheet

U.S. Patent   Apr. 16, 1991   Sheet 1 of 1   5,008,737
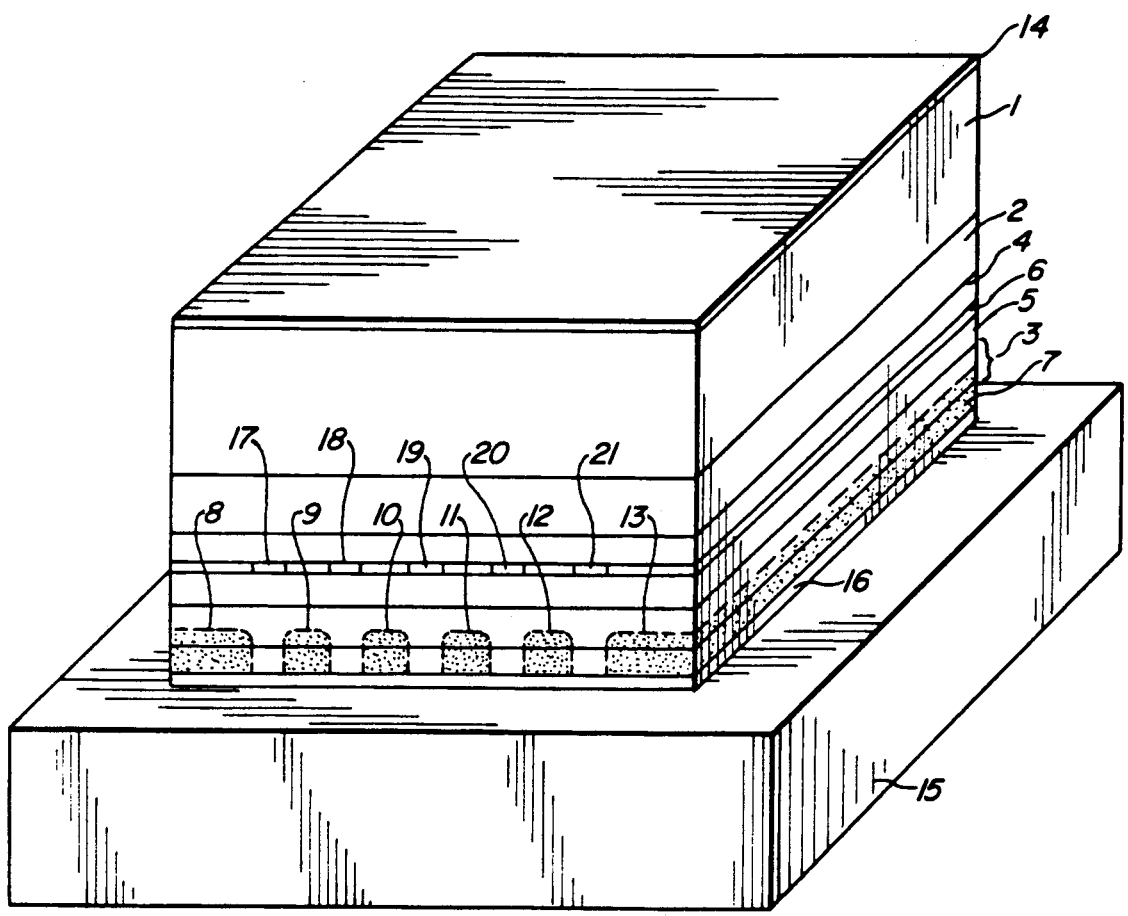

DIAMOND COMPOSITE HEAT SINK FOR USE WITH SEMICONDUCTOR DEVICES

FIELD OF THE INVENTION

This invention relates to a composite heat sink material for use with a semiconductor device which has a very high thermal conductivity and a coefficient of thermal expansion which can be matched to that of the semiconductor device. More particularly, the composite is comprised of diamond particles embedded in a metal matrix.

BACKGROUND OF THE INVENTION

A variety of electronic devices are comprised of a semiconductor component which is attached to another material which functions, at least in part, as a heat sink or heat-conductive material. Such devices include, but are not limited to, those which contain one or more p-n junctions. Examples of such devices include laser diodes (as used herein, this term includes laser diode arrays), light-emitting diodes (as used herein, this term includes superluminescent diodes and superluminescent diode arrays), thyristors, triacs and microwave electron transfer devices. In order to minimize any thermally induced mechanical stress on the brittle semiconductor component of the device and to maximize the removal of heat from the semiconductor component of the device, it is required that the heat conductive material have the following properties: (1) A coefficient of thermal expansion which approximates that of the semiconductor component as closely as possible; and (2) The highest possible thermal conductivity.

An optimized heat conductive material is particularly important for use in the fabrication of semiconductor lasers. Such devices contain a p-n junction which forms a diode, and this junction functions as the active medium of the laser. Such devices, which are also referred to as laser diodes, can be constructed from a variety of semiconductor materials which include: (a) compounds such as GaAs and InP; (b) ternary alloys such as AlGaAs, GaAsP and InGaAs; and (c) quaternary alloys such as InGaAsP, InGaAlP and AlGaAsP. The efficiency of such lasers in converting electrical power to output optical radiation is relatively high and, for example, can be in excess of 50 percent. However, electrical power which is not converted to light by such a device is lost as heat.

Removal of by-product heat from a laser diode during operation is important since the lifetime of such a device is a strong function of operating temperature, with an increased operating temperature resulting in a reduced lifetime for the device. For example, the lifetime of a conventional gallium arsenide based laser diode will decrease by about an order of magnitude for a 40° C. rise in temperature. Accordingly, simple heat transfer considerations suggest that a laser diode should be in contact with a heat sink material of the highest possible thermal conductivity in order to remove by-product heat as quickly as possible. However, if there is a mismatch between the coefficient of thermal expansion of the laser diode and that of the heat sink, the brittle semiconductor diode will experience mechanical stress during operation as a consequence of by-product heat production, and the magnitude of this stress will be a function of the size of the mismatch. Such stress can cause device failure within a few hours if it is severe and uncompensated.

The prior art has utilized two major approaches to the selection of a heat-conductive material for combination with a semiconductor. One approach has been to select a metal alloy or a composite structure which has a relatively high thermal conductivity and also has a coefficient of thermal expansion which is substantially identical with that of the semiconductor. For example, the coefficient of thermal expansion for GaAs is about $6.6 \times 10^{-6}/°C$. and is well matched with that of a tungsten-copper alloy containing 85% by weight of tungsten ($6.5 \times 10^{-6}/°C$.) and of a molybdenum-copper alloy containing 85% by weight of molybdenum ($6.6 \times 10^{-6}/°C$.). U.S. Pat. No. 3,969,754 (Kuniya et al.; Jul. 13, 1976) discloses the use of a composite heat-conductive material for use in combination with a semiconductor where the composite is composed of a plurality of fibers embedded in a metal matrix where the fibers have a coefficient of thermal expansion which is substantially equal to or lower than that of the semiconductor and the metal matrix has a thermal conductivity which is greater than that of the fibers. Similarly, U.S. Pat. No. 4,470,063 (Arakawa et al., Sept. 4, 1984) discloses the use of a composite of carbon fibers in a copper matrix as a conductor of heat and electricity for combination with a semiconductor. Unfortunately, this approach has not been entirely satisfactory because at least one member of the alloy or composite has had a relatively low thermal conductivity, which results in a lower than desirable overall thermal conductivity. With respect to the above-cited examples, the tungsten and molybdenum of the alloys and the fibers of the composites have relatively low thermal conductivities.

A second approach for the selection of a heat-conductive material for combination with a semiconductor has been to: (a) select a material which has an extremely high thermal conductivity, such as diamond, silver or copper, without regard for mismatch between the coefficients of thermal expansion, and (b) bond the heat-conductive and semiconductor materials together with a soft metal such as indium or a suitable soft metal alloy. In general, the larger the thermal coefficient of expansion mismatch between the heat-conductive material and the semiconductor, the softer the bond between the two must be. With respect to laser diodes, this approach is quite satisfactory for low power devices, for example about 100 mW or less, which produce relatively little heat during operation. Unfortunately, this approach is not satisfactory for higher power laser diodes.

The best heat sink materials from a thermal conductivity point of view include gold, silver, copper, aluminum and diamond. Unfortunately, these materials have a coefficient of thermal expansion which is very different from that of typical semiconductor materials. This will be illustrated by reference to the values which are set forth below in Table I.

TABLE I

| Material | Thermal Conductivity, Watt/cm. °C. | Coefficient of Thermal Expansion, $10^{-6}/°C$. |
|---|---|---|
| Semiconductors | | |
| InP | 0.80 | 4.75 |
| GaP | 1.1 | 5.91 |
| GaAs | 0.37 | 6.63 |
| Ge | 0.64 | 5.75 |
| AlAs | — | 5.20 |
| InAs | 0.29 | 5.16 |

TABLE I-continued

| | | |
|---|---|---|
| Si | 1.24 | 2.5 |
| Metals | | |
| Cu | 4.0 | 16.6 |
| Ag | 4.3 | 19 |
| Au | 3.2 | 14.2 |
| Al | 2.4 | 25 |
| Diamond | | |
| Type Ia | 9.9 | 0.8[a] |
| Type IIa | 23.2 | 0.8[a] |
| Type IIb | 13.6 | 0.8[a] |

[a]This value is reported for diamond at 20° C. - see Kirk-Othmer Encyclopedia of Chemical Technology, Vol. 4, 3rd edition, John Wiley & Sons (1978), p. 669.

U.S. Pat. No. 2,382,666 (Rohrig et al.; Aug. 14, 1945) discloses the preparation of diamond composite tools by a process which involves: (a) coating small diamond particles with a metal film, for example by evaporation, glow discharge, cathodic sputtering or thermal decomposition of a metal carbonyl; and (b) incorporating the coated diamonds into a metal matrix. Similarly, U.S. Pat. No. 4,378,233 (Carver; Mar. 29, 1983) is directed to a grinding wheel which comprises a composite prepared by embedding diamond particles in a matrix which includes a mixture of aluminum, zinc, copper and tin and can also include up to 50% by volume of a dry film lubricant such as polytetrafluoroethylene, graphite, molybdenum disulfide and hexagonal boron nitride.

SUMMARY OF THE INVENTION

The present invention is directed to the discovery that a composite comprised of diamond particles embedded in a metal matrix is a highly satisfactory material for use to conduct heat away from a semiconductor material since the composite has a high thermal conductivity and the coefficient of thermal expansion of the composite can be matched to that of the semiconductor material with which it is combined.

One embodiment of the invention is a structure comprising a semiconductor in thermal contact with a heat-conductive composite, wherein said composite is comprised of diamond particles embedded in a metal matrix and said composite has a coefficient of thermal expansion which is substantially the same as that of said semiconductor.

Another embodiment of the invention is a heat sink for mounting the semiconductor component of a heat-dissipating semiconductor electronic device wherein said heat sink is adapted for mounting said semiconductor component thereon and is comprised of a composite of diamond particles embedded in a metal matrix.

Another embodiment of the invention is an electronic device which comprises a semiconductor in thermal contact with a thermally conductive composite, wherein said composite is comprised of diamond particles embedded in a metal matrix and said composite has a coefficient of thermal expansion which is substantially the same as that of said semiconductor.

An object of the invention is to provide an improved heat conducting material for use in combination with a semiconductor material.

Another object of the invention is to provide an improved heat sink material for use with semiconductor electronic devices.

Another object of the invention is to provide a composite material of high thermal conductivity which also has a coefficient of thermal expansion that can be matched to semiconductor materials.

Another object of the invention is to provide a composite material having a coefficient of thermal expansion which can be matched to that of semiconductor materials and also having a thermal conductivity which is higher than that of prior art materials for which such matching is possible.

A still further object of the invention is to provide a heat sink material for a laser diode which has an extremely high thermal conductivity and also has a coefficient of thermal expansion which is substantially the same as that of the laser diode.

BRIEF DESCRIPTION OF THE DRAWING

The attached drawing is a perspective view of a laser diode array which is mounted on a heat sink composed of the diamond composite of this invention.

DETAILED DESCRIPTION OF THE INVENTION

We have found that a composite comprised of diamond particles embedded in a metal matrix is a highly satisfactory heat-conductive material for combination with a semiconductor since: (a) the coefficient of thermal expansion of the composite can be matched to that of the semiconductor by adjustment of the composite composition, and (b) the composite can be constructed from materials which possess some of the highest known thermal conductivities. In addition, the composite will typically be a good electrical conductor and, accordingly, can be used as an electrode or conductor of electricity for the semiconductor component of a semiconductor electronic device.

Any type of diamonds can be used in the practice of the invention. For example, Type Ia, Ib, IIa and IIb diamonds are all suitable. Type Ia diamonds contain about 0.1% nitrogen in platelet form, and most natural diamonds fall into this group. Type Ib diamonds contain up to about 0.2% nitrogen in dispersed form, and most synthetic diamonds fall into this group. Diamonds of Type IIa and IIb are substantially free of nitrogen. The thermal conductivity of diamond is a function of purity and ranges from about 9 to 23 Watt/cm. °C. The highest thermal conductivity is observed in the purest diamonds, and the use of such diamonds represents a preferred embodiment of the invention. Synthetic Type Ib diamonds containing less than about 100 ppm of nitrogen impurity and less than about 10 ppm of catalyst metals have a thermal conductivity of about 20 Watt/cm. °C. and are highly preferred for use in the practice of this invention.

The diamond particles employed in the practice of this invention desirably have a largest dimension which is smaller than about 106 μm (140 mesh), preferably less than about 38 μm (400 mesh), and more preferably less than about 3 μm. If desired, the diamond particles can be metal coated before incorporation into the metal matrix. Such a coating can be of any desired metal or metals and can be applied by any conventional technique, for example, vapor deposition in a vacuum or by chemical means. Preferred coating metals are those which have a high thermal conductivity such as copper, silver, gold and aluminum.

The proportions of diamond particles and metal or metals in the composite of this invention are adjusted in order to achieve the desired coefficient of thermal expansion for the composite. These proportions are easily adjusted on an emperical basis, and they are preferably selected in such a manner that the resulting composite has a coefficient of thermal expansion which is substantially the same as that of the semiconductor with which it is to be combined.

As used herein, the term "semiconductor" refers to a material in which an electric current is carried by electrons or holes and is characterized by a bandgap which is the difference in energy between an electron in the material's normally filled valence band and an electron in the conduction band of the material. Such materials have a relatively low electrical conductivity which can be increased by several orders of magnitude by doping with electrically active impurities. Conventional semiconductors include silicon, germanium and various combinations of elements from Groups III and V of the Periodic Table such as InAs, InP, GaP, GaAs, AlAs, AlGaAs, InGaAs, InGaAsP, InGaP and InGaAlP. A tabulation of some of the more common semiconductors and their general properties is set forth at pages E-102 through E-105 of the *Handbook of Chemistry and Physics*, 68th Ed., CRC Press, Inc., Boca Raton, Fla. (1987-1988). The heat-conductive diamond composite of this invention can be used in combination with any semiconductor. However, the difference between the coefficient of thermal expansion of the composite and that of the semiconductor with which it is combined is desirably less than about $2 \times 10^{-6}/°C.$, preferably less than about $1 \times 10^{-6}/°C.$, and more preferably less than about $0.5 \times 10^{-6}/°C.$ Semiconductors have been widely used for the construction of electronic devices. Many such devices dissipate heat during operation as a consequence of unwanted heat formation in the semiconductor component. The diamond composite of this invention is a highly satisfactory heat sink material for use in conducting heat away from the semiconductor component of such devices. Although the invention is not to be so limited, the diamond composite is particularly well suited for combination with laser diodes and light-emitting diodes.

The diamond composite of this invention must, of course, be placed in thermal contact with a semiconductor in order to conduct heat away from the semiconductor. Such thermal contact can involve a direct physical contact between the composite and the semiconductor. Alternatively, the semiconductor and composite can be attached to each other by means of heat-conducting solder or adhesive. For example, a thin layer of a conventional soft solder such as elemental indium and various alloys such as Au-Sn, Au-In, Pb-In, Sn-Pb, Sn-In, and Pb-In-Ag systems can be used.

The diamond composite of this invention can be prepared by any conventional technique. For example, the metal or metals of the matrix in powder form can be thoroughly mixed with an appropriate amount of the diamond particles and the resulting mixture hot-pressed. For metals such as copper, aluminum, silver and gold, hot-pressing can be carried out at about 800 kg/cm$^2$ and 350° C. for about 10 minutes. If desired, the hot pressing can be carried out under vacuum or in an inert atmosphere. In the event that a metal alloy is to be used as the metal matrix, the composite can be easily formed from a mixture of diamond particles with the alloy in powder form. If desired, metal clad diamond particles can be utilized in combination with a matrix metal which is different from the cladding metal.

The attached drawing illustrates one specific embodiment of the invention in the form of a GaAlAs-type five-stripe double heterostructure laser diode array which is mounted on a diamond composite heat sink. It will be understood, however, that the subject invention is not to be limited to the illustrated embodiment.

With reference to the drawing, the semiconductor component of the laser diode array consists of layers 1 through 7. Layer 1 is comprised of n-type GaAs having a thickness of about 100 μm, layers 2 and 3 are outer cladding layers having a thickness of about 2 μm which are comprised of n-type $Ga_{0.35}Al_{0.65}As$ and p-type $Ga_{0.35}Al_{0.65}As$ respectively, layers 4 and 5 are inner cladding layers having a thickness of about 0.1 μm which are comprised of n-type $Ga_{0.7}Al_{0.3}As$ and p-type $Ga_{0.7}Al_{0.3}As$ respectively, layer 6 is a single quantum well active layer comprised of undoped $Ga_{0.94}Al_{0.06}As$ having a thickness of about 0.02 μm, and layer 7 is comprised of p-type GaAs having a thickness of about 1 μm. The n- and p-type dopants can be Se and Zn, respectively. It will be understood, of course, that the precise chemical composition and thickness of the various semiconductor layers in a device of this type can vary widely, and the above-stated values are solely for the purpose of illustration. The stippled regions 8, 9, 10, 11, 12 and 13 in the drawing are areas of high-resistivity in layers 3 and 7 which can be introduced by proton implantation through a suitable photoresist mask. Layer 14 is an ohmic contact which, for example, can be comprised of gold or a gold alloy. Heat sink 15 is comprised of the diamond composite of this invention, and layer 16 is a heat and current conducting solder, such as indium, which has a thickness of about 2 to 3 μm and serves to attach the semiconductor component of the laser diode (layers 1 through 7) to heat sink 15. Heat sink 15 has a coefficient of thermal expansion which is substantially the same as that of semiconductor layer 7 and is comprised of diamond particles having a largest dimension of about 2 to 3 μm. Heat sink 15 serves as: (a) one electrode for the laser diode array, and (b) means for conducting waste heat away from the semiconductor component of the device. If desired, heat sink 15 can be attached to a thermoelectric cooler or other cooling means (which is not shown in the drawing) to dispose of the heat which is conducted away from the semiconductor component by heat sink 15. When an electric current is applied between ohmic contact 14 and heat sink 15 from a power supply (which is not shown in the drawing), laser light having a wavelength of about 808 nm is emitted from areas 17 through 21 which have a stripe geometry and are defined by the areas of high- and low-resistivity in layers 3 and 7.

We claim:

1. A structure comprising a semiconductor in thermal contact with a heat-conductive composite which is comprised of a metal matrix in which diamond particles have been thoroughly mixed and embedded wherein the proportions of said diamond particles and said metal are selected to form a composite having a coefficient of thermal expansion which is substantially the same as that of said semiconductor, and wherein said diamond particles have a largest dimension which is smaller than about 3 μm.

2. The structure of claim 1 wherein said metal matrix is comprised of at least one metal selected from the group consisting of copper, silver, gold and aluminum.

3. The structure of claim 1 wherein said metal was in the form of a powder before being thoroughly mixed with said diamond particles, and wherein said composite was formed by hot pressing the thorough mixture of said diamond particles and said metal powder.

4. The structure of claim 1 wherein the difference between the coefficient of thermal expansion of said composite and that of said semiconductor is less than about $1 \times 10^{-6}/°C$.

5. The structure of claim 1 wherein said semiconductor is comprised of a material selected from the group consisting of silicon, germanium and combinations of elements from Groups III and V of the Periodic Table.

6. A heat sink for mounting thereon the semiconductor component of a heat-dissipating electronic device, comprising: a metal matrix in which diamond particles have been thoroughly mixed and embedded, wherein said diamond particles have a largest dimension which is smaller than about 3 μm.

7. The heat sink of claim 6 wherein said electronic device is selected from the group consisting of laser diodes and light-emitting diodes.

8. The heat sink of claim 6 wherein said metal matrix is comprised of at least one metal selected from the group consisting of copper, silver, gold and aluminum.

9. The heat sink of claim 6 wherein said metal was in the form of a powder before being thoroughly mixed with said diamond particles, and wherein said matrix was formed by hot pressing the thorough mixture of said diamond particles and said metal powder.

10. The heat sink of claim 6 wherein said semiconductor component is comprised of a material selected from the group consisting of silicon, germanium and combinations of elements from Groups III and V of the Periodic Table.

11. The heat sink of claim 6 wherein the proportions said diamond particles and said metal are selected to form a composite having a coefficient of thermal expansion which is substantially the same as that of said semiconductor component.

12. The heat sink of claim 10 wherein the difference between the coefficient of thermal expansion of said composite and that of said semiconductor is less than about $1 \times 10^{-6}/°C$.

13. An electronic device which comprises a semiconductor in thermal contact with a thermally conductive composite the composite comprising: a metal matrix in which diamond particles have been thoroughly mixed and embedded, wherein the proportions of said diamond particles and said metal are selected to form a composite having a coefficient of thermal expansion which is substantially the same as that of the semiconductor, and wherein said diamond particles have a largest dimension which is smaller than about 3 μm.

14. The electronic device of claim 13 wherein said metal matrix is comprised of at least one metal selected from the group consisting of copper, silver, gold and aluminum.

15. The electronic device of claim 13 wherein the difference between the coefficient of thermal expansion of said composite and that of said semiconductor is less than about $1 \times 10^{-6}/°C$.

16. The electronic device of claim 13 wherein said semiconductor is comprised of a material selected from the group consisting of silicon, germanium and combinations of elements from Groups III and V of the Periodic Table.

* * * * *

UNITED STATES PATENT AND TRADEMARK OFFICE
CERTIFICATE OF CORRECTION

PATENT NO. : 5,008,737

DATED : April 16, 1991

INVENTOR(S) : Robert D. Burnham and Ricardo S. Sussmann

It is certified that error appears in the above-identified patent and that said Letters Patent is hereby corrected as shown below:

Column 5, line 26, "264 desirably" should read --desirably--.

Signed and Sealed this

First Day of December, 1992

Attest:

DOUGLAS B. COMER

*Attesting Officer*  *Acting Commissioner of Patents and Trademarks*